United States Patent
Harris et al.

[11] Patent Number: 5,544,615
[45] Date of Patent: Aug. 13, 1996

[54] SYNTHESIS AND GROWTH PROCESSES FOR ZINC GERMANIUM DIPHOSPHIDE SINGLE CRYSTALS

[75] Inventors: Meckie T. Harris, Nashua, N.H.; David F. Bliss, Arlington, Mass.; Alton F. Armington, Lexington, Mass.; William M. Higgins, Westborough, Mass.; George G. Bryant, Waltham, Mass.

[73] Assignee: The United States of America as represented by the Secretary of the Air Force, Washington, D.C.

[21] Appl. No.: 282,869

[22] Filed: Jul. 29, 1994

[51] Int. Cl.$^6$ .............................. C01B 25/00; C30B 15/00
[52] U.S. Cl. .................. 117/18; 117/77; 117/78; 423/299
[58] Field of Search .............................. 117/17, 18, 77, 117/78; 423/299

[56] References Cited

U.S. PATENT DOCUMENTS

| | | | |
|---|---|---|---|
| 3,617,381 | 11/1971 | Hanak | 117/235 |
| 3,914,525 | 10/1975 | Ehman | 428/539 |
| 3,945,935 | 3/1976 | Torp et al. | 252/62.3 V |
| 4,637,864 | 1/1987 | Covino et al. | 204/61 |
| 4,798,660 | 1/1989 | Ermer et al. | 204/192.17 |

OTHER PUBLICATIONS

David F. Bliss et al, "Synthesis and growth processes for zinc germanium diphosphide," *Journal of Crystal Growth* 137 (1994), pp. 145–149.

H. M. Hobgood et al, "$ZnGeP_2$ grown by the liquid encapsulated Czochralski method," *J. Appl. Phys*, 73(8), 15 Apr. 1993, pp. 4030–4037.

*Primary Examiner*—Wayne Langel
*Attorney, Agent, or Firm*—Stanton E. Collier

[57] ABSTRACT

New single crystals of $ZnGeP_2$ are grown by a chemical vapor transport process from bulk synthesized polycrystalline $ZnGeP_2$ using the LEK process with a controlled injection of phosphorus. The synthesis of the bulk is based on direct injection of phosphorus through a $B_2O_3$ encapsulant and reaction with the zinc germanium melt, resulting in synthesis of a large melt (350 g) of $ZnGeP_2$. When crystallization is followed by cooling the congruent melt down through the $\alpha$-$\beta$ transition temperature (952° C.) as is typical for bulk growth processes, the result is the growth of partially disordered material. This material is placed in a two zone heated furnace where iodine is used to transport the intermediate product to the growth zone where the single crystals grow, at a temperature below the $\alpha$-$\beta$ phase transition. The resulting crystals produced contained a second cubic phase, which has not been reported previously.

5 Claims, 3 Drawing Sheets

NUTRIENT: ZINC GERMANIUM DIPHOSPHIDE
TRANSPORT MEDIUM: IODINE

SYNTHESIS AND GROWTH PROCESSES FOR ZINC GERMANIUM DIPHOSPHIDE SINGLE CRYSTALS

STATEMENT OF GOVERNMENT INTEREST

The invention described herein may be manufactured and used by or for the Government for governmental purposes without the payment of any royalty thereon.

BACKGROUND OF THE INVENTION

The present invention relates to a process for the growth of single crystals, and, in particular, a process for the growth of $ZnGeP_2$ single crystals.

Several different growth techniques have been used by researchers to obtain single crystals of $ZnGeP_2$. The equilibrium vapor pressure of phosphorous over $ZnGeP_2$ at the 1025° C. melting point is about 3.5 atm. The disordered β phase is stable above 952 C., however the crystal structure of the high temperature phase has never been determined. Only the tetragonal α phase, stable below 952 C., has been identified.

A typical method for $ZnGeP_2$ synthesis involves the high temperature reaction of small amounts of the elements Zn, Ge, and P in a sealed quartz ampoule. The high vapor pressure of phosphorous over the melt during the reaction process and the rupture strength of the quartz ampoule has limited the charge size in the past to about 40 g. An adequately sized crystal growth charge then requires the use of several presynthesized charges.

SUMMARY OF THE INVENTION

The present invention involves a two step process of synthesis and growth of $ZnGeP_2$. In the first step, a high pressure liquid encapsulated Kyropoulos (LEK) system was used to synthesize the polycrystalline $ZnGeP_2$ charges. A 4 inch diameter pyrolytic boron nitride (PBN) crucible containing appropriate amounts of Zn, Ge, and $B_2O_3$ was placed in a graphite susceptor. The susceptor was inductively heated by a radio frequency (RF) coil placed around it. A phosphorus filled quartz injector was heated by radiation from the crucible. A nitrogen overpressure of approximately 500 psi was kept over the encapsulated melt to suppress the evaporative loss of phosphorus and zinc. The injector transferred the phosphorus to the melt through a transfer tube. The phosphorus vapor bubbled into and reacted with the Zn and Ge liquid to form polycrystalline $ZnGeP_2$. A cold alumina rod was used to nucleate the molten $ZnGeP_2$ charge as it was cooled down.

In the second step, single crystals are produced by a vapor transport method. Crystal growth by chemical vapor transport (CVT) involves the movement of a polycrystalline charge from one heated region of a tube to a second heated region under the influence of a transporting agent such as iodine. Seeded or unseeded crystallization occurs in the second heated region. Success of the technique relies on the formation of a gaseous intermediate at the nutrient zone temperature and the dissociation of this intermediate at the crystallization zone temperature. The nutrient zone temperature was set at 975° C. and the growth zone temperature was set at 875° C. The appropriate amount of iodine was added to the ampoule to give approximately one atmosphere of iodine pressure at the final growth conditions. The ampoule was loaded into a two zone Kanthal resistance furnace, and heated over 36 h to the final growth temperatures. The growth conditions were maintained for 14 days. The furnace was then shut off and allowed to cool to room temperature over a 4 h period. Crystallites of $ZnGeP_2$ grew as single crystals at the coldest portion of the tube.

Therefore, one object of the present invention is a process to grow single crystals of $ZnGeP_2$.

Another object of the present invention is a process to grow single crystals of this material in bulk amounts.

Another object of the present invention is a process to grow single crystals of this material starting from a polycrystalline material.

Another object of the present invention is a process to produce bulk quantities of polycrystalline material.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 2:
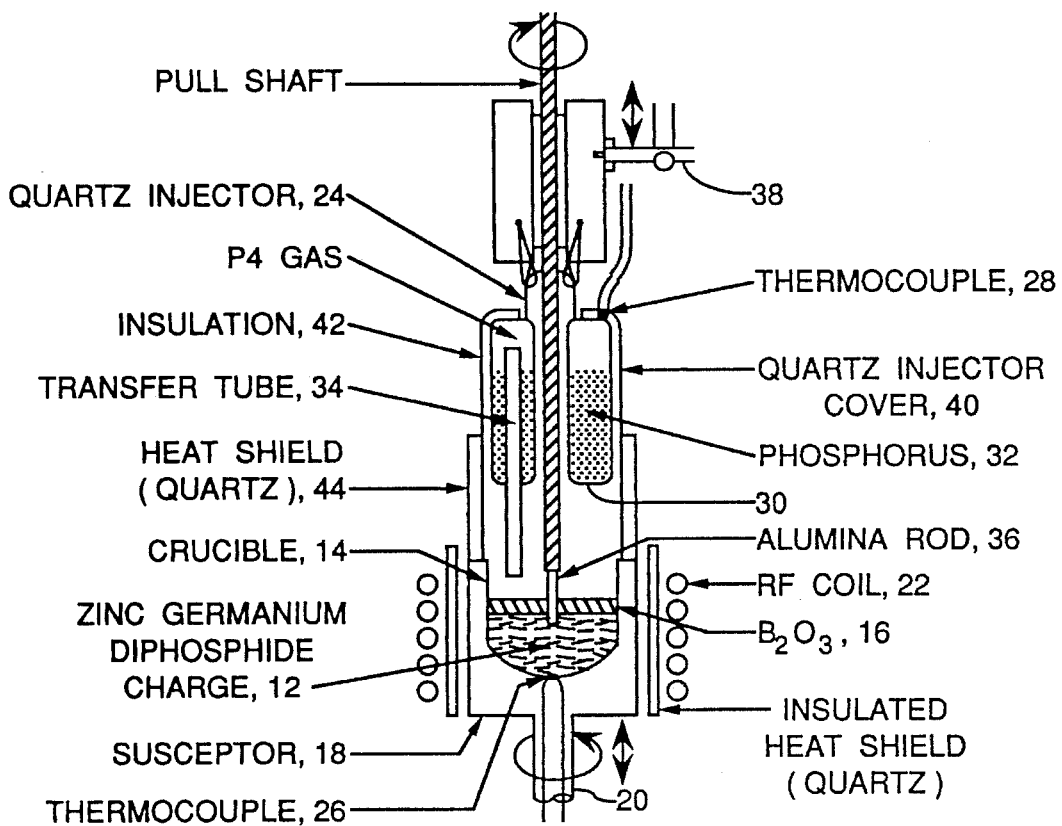
FIG. 2 illustrates the apparatus used for the growth of polycrystalline material of the present invention.

A high pressure liquid encapsulated Kyropoulos (LEK) system 10, FIG. 2, was used to synthesize a polycrystalline $ZnGeP_2$ charge 12. A 4 inch diameter pyrolytic boron nitride (PBN) crucible 14 containing appropriate amounts of Zn, Ge, and $B_2O_3$, such as 122 g of Zn, 129 g of Ge, and 125 g of $B_2O_3$ encapsulant 16 was placed in a graphite susceptor 18 which could be rotated and lifted by a hollow stainless steel shaft 20. The susceptor 18 was inductively heated by a radio frequency (RF) coil 22 placed around it. A phosphorus filled quartz injector 24 was heated by radiation from the crucible 14. A nitrogen overpressure of approximately 500 psi was kept over the encapsulated melt to suppress the evaporative loss of phosphorus and zinc. A thermocouple 26 was inserted through the stainless steel shaft 20 to measure the crucible temperature. Another thermocouple 28 was pressed against the top of the quartz injector 24 ampoule to measure the phosphorus injector temperature. The injector 24, FIG. 2, consists of a 3 inch diameter by 4 inch long quartz ampoule 30 containing the phosphorus 32 to be injected into the Zn and Ge melt through a transfer tube 34. The injector 24 can be moved vertically by means of arm 38. The ampoule 30 slides within an injector cover 40 which has insulation 42 therein. The cover 40 fits closely within a heat shield 44. The melt was quickly heated from room temperature to 1010° C. in 40 min to minimize the loss of Zn. An excess of 5% by weight of Zn was used to compensate for possible evaporative losses during the heatup phase of the synthesis process. Evaporative loss of Zn occurred before the $B_2O_3$ encapsulant 16 softened completely to cover the Zn and Ge. The Zn was visibly fuming at 644° C. and an unknown amount of Zn was lost before the $B_2O_3$ melted down and sealed off the Zn and Ge at 804° C. During the 63 min injection process, the crucible 14 was heated from 1010° to 1234° C. and the injector 24 was heated from 226° to 634° C. The heating rate was adjusted to steadily increase the injector temperature until the injection was completed. This made the internal injector pressure slightly higher than the ambient, preventing the melt from being pulled up into the injector tube and forming a solid plug.

The phosphorus vapor bubbled into and reacted with the Zn and Ge liquid to form $ZnGeP_2$. A total of 103 g of phosphorous 32 was injected into the melt. The melt was calculated to be about 2 mol % phosphorus deficient. After completion of the synthesis reaction and removal of the cooled charge 12 from the furnace, it was observed that the encapsulant had turned a reddish brown. This indicated a possible reaction between the $B_2O_3$ and the $ZnGeP_2$ constituents. As shown in FIG. 2, a cold alumina rod 36 was used to nucleate the molten $ZnGeP_2$ charge as it was cooled down. The LEK process has shown itself capable of producing in a few hours a large 350 g polycrystalline charge of $ZnGeP_2$ as shown in FIG. 2.

Figure 1:
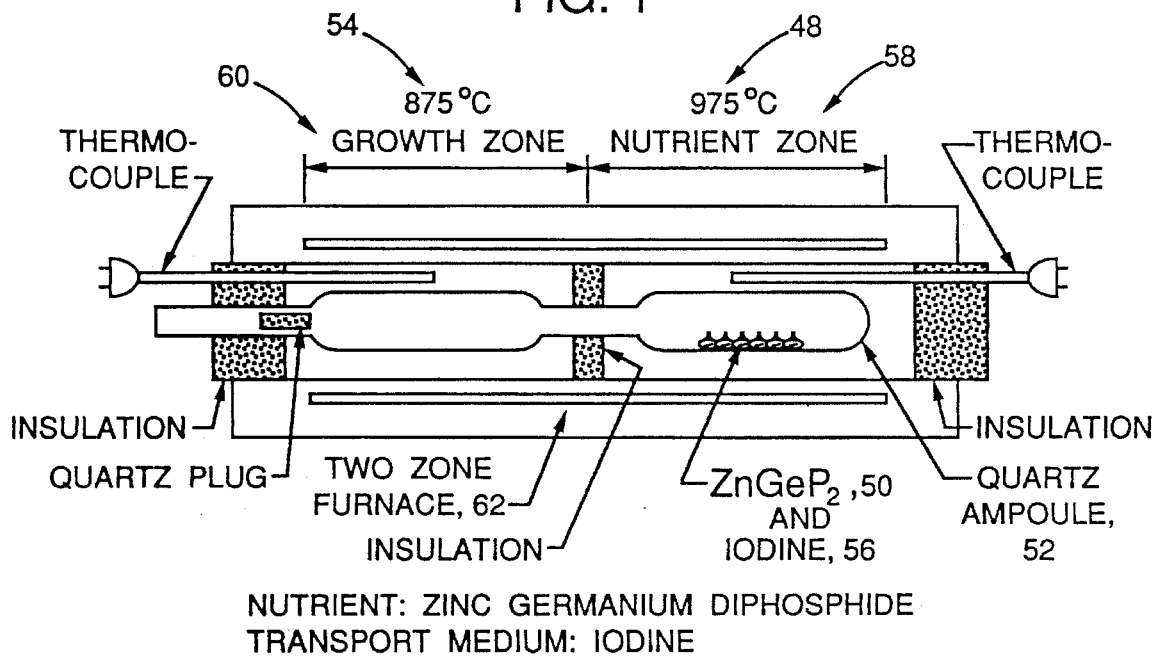
FIG. 1 illustrates the crystal growth furnace used to grow crystals of the present invention.

Single crystal growth by chemical vapor transport (CVT), FIG. 1, involves the movement of a polycrystalline charge from a higher temperature heated region 48 of an ampoule 50 to a lower heated region 54 under the influence of a transporting agent such as iodine 56. Seeded or unseeded crystallization occurs in the second heated region 54. Success of the technique relies on the formation of a gaseous intermediate at the nutrient zone temperature, region 48, and the dissociation of this intermediate at the crystallization zone temperature.

Certain assumptions must be met for successful transport and growth to occur. The temperature of the nutrient zone 58 must be high enough to allow the ZnGeP to decompose. The transport is from the higher to the lower temperature, usually in the range from 1000° C. at the high end to 800° C. at the low end. Although phosphorus and zinc will readily transport at these temperatures germanium will not, unless some intermediate is formed. The chemical transport of germanium has been studied and the following reaction has shown promise at temperatures below 1000° C.

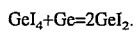

Figure 4:
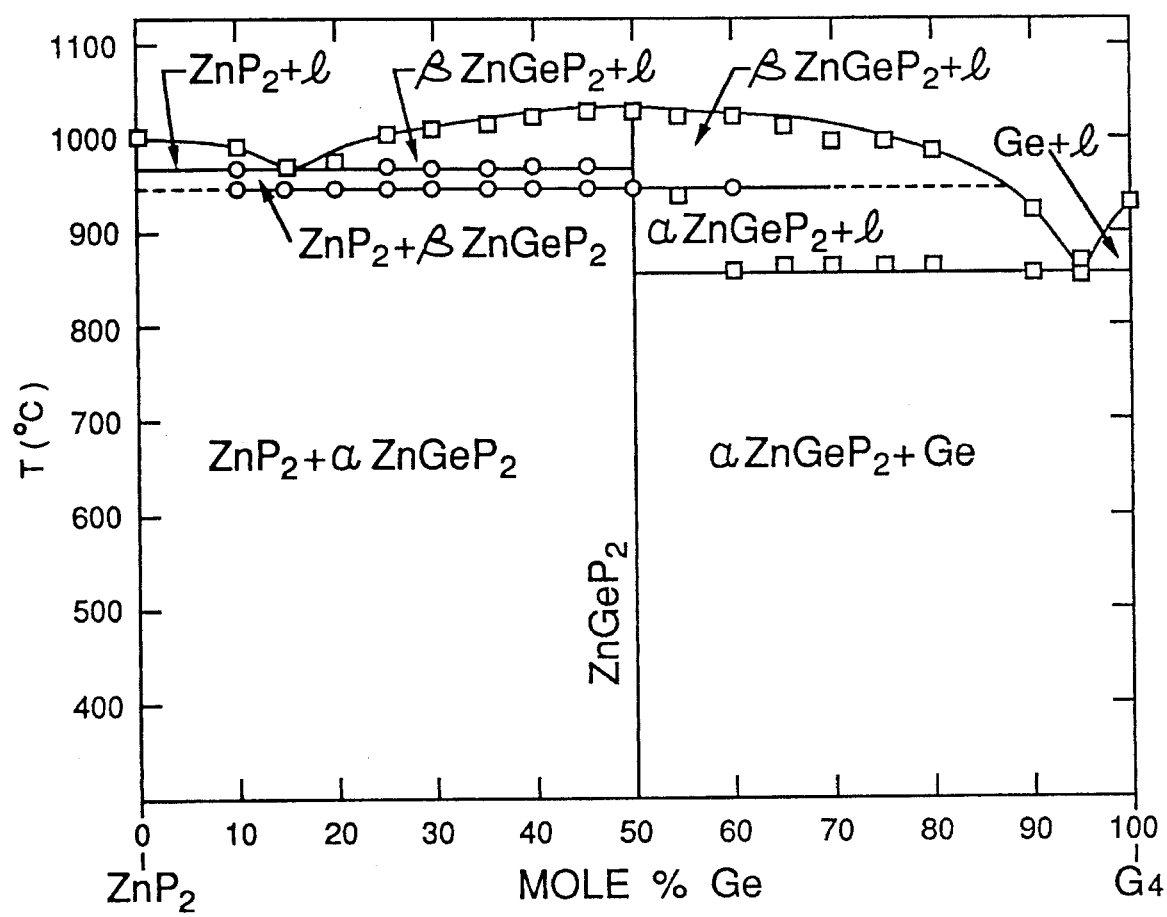
FIG. 4 illustrates the $ZnP_2$—Ge pseudobinary phase diagram for the material of the present invention.

The equilibrium temperature of this reaction is calculated to be 973° C. The nutrient zone 58 temperature must be held above this point in order to maintain transport to the colder zone. A pseudobinary phase diagram is shown in FIG. 4.

The nutrient zone 58 temperature was set at 975° C. and the growth zone 60 temperature was set at 875° C. as shown schematically in FIG. 1. The appropriate amount of iodine was added to the ampoule 52 to give approximately one atmosphere of iodine pressure at the final growth conditions. 1 g of J. T. Baker sublimed iodine was used as a transporting agent 56 and 3.5 g of presynthesized $ZnGeP_2$ as the nutrient 50. The loaded ampoule 52 was chilled with dry ice, not shown, to prevent loss of iodine and the ampoule was evacuated with a roughing pump, not shown, while sealing. The ampoule 52 was loaded into a two zone Kanthal resistance furnace 62, and heated over 36 h to the final growth temperatures. The growth conditions were maintained for 14 days. The furnace 62 was then shut off and allowed to cool to room temperature over a 4 h period. Some of the phosphorus appeared to have vaporized and condensed in the growth zone 60 during cool-down. The ampoule 52 was carefully opened under a solution of 50% $H_2O_2$ +50% $H_2O$ by volume. This reacts with the excess phosphorus and iodine in the ampoule. The $ZnGeP_2$ formed crystallites at the coldest portion of the tube. These were single crystals of dimensions of 1 to 10 millimeters.

Figure 3A:
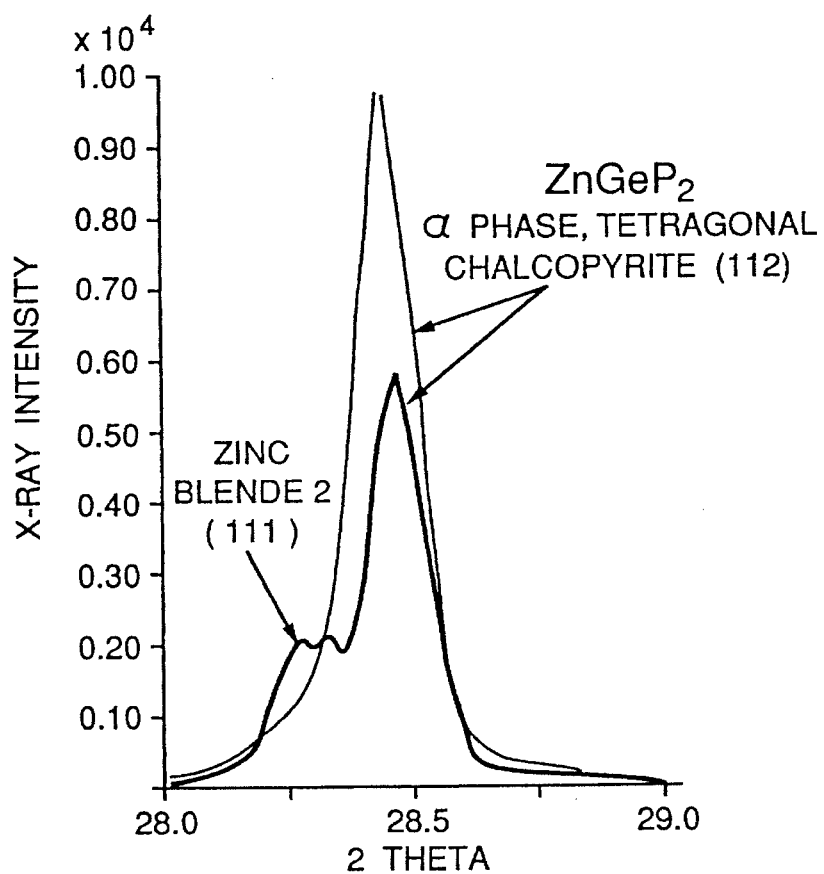
FIG. 3 are x-ray diffraction patterns of the material of the present invention.
Figure 3B:
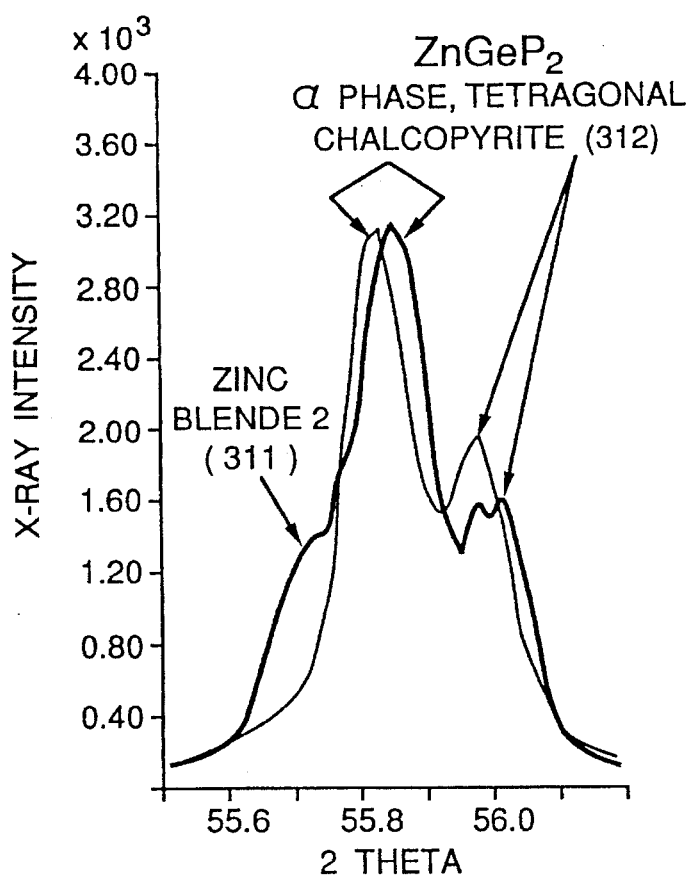

The crystal structures that resulted from the first step of the process to grow bulk $ZnGeP_2$ were measured by X-ray diffraction powder patterns, FIG. 3. The measured X-ray spectrum of the synthesized charge was determined to be the tetragonal phase of $ZnGeP_2$, with a residual excess of Ge, consistent with the phosphorus deficiency mentioned earlier. The $ZnGeP_2$ grown in the second step by the CVT process also shows tetragonal structure from x-ray analysis,however, side lobes appear on some, but not all of the peaks. Expansion of the peaks as shown in FIG. 3 shows definite side lobes not reported in the literature which can be identified as a cubic phase. Chemical trace analysis was performed on bulk synthesized and CVT material. Although the bulk synthesized material had several parts per million of Fe and Pb, probably from the impure starting material, the CVT grown $ZnGeP_2$ had reduced amounts of B, Al, and Pb, and increased amounts of S, Fe, Ni, Cu, and I, possibly due to incorporation of impurities in the reagent iodine. The low concentrations of trace impurities could not account for any shift in the X-ray diffraction peaks.

The diffraction lines for related compounds such as $ZnP_2$ were compared to the measured peaks. The side lobes on the (112) and (312) peaks of $ZnGeP_2$, FIG. 3, can not be explained by the presence of a second phase of zinc diphosphide, or other related compounds.

The side lobe diffraction lines can be fit to a face-centered cubic model with a lattice parameter of 5.468 Å. A referenced X-ray pattern for zinc blende β phase $ZnGeP_2$ does not exist, since the actual structure of the high temperature phase is still unknown; in fact it has not been possible to quench this phase to room temperature. FIG. 3 shows the CVT process $ZnGeP_2$ appears to be primarily the tetragonal phase with a small amount of an unidentified cubic phase.

The structure of $ZnGeP_2$ has been established as chalcopyrite, however, all the crystals investigated were grown by cooling the high temperature phase from the melt. For the first time, we have investigated crystal growth at temperatures below the high temperature phase transition. In the CVT process, growth occurs at 875° C., where the high temperature phase is not formed. Since atomic ordering can occur at these temperatures, this would explain the appearance of a cubic phase.

Large quantities of $ZnGeP_2$ have been successfully synthesized by the LEK process. The large capacity and faster throughput is required to meet the increased demands for $ZnGeP_2$. Although the method described is simple and relatively quick, the resulting polycrystal has quenched-in defects which reduce the infrared transmission through this material. A second step process for single crystal growth has been described, in which $ZnGeP_2$ has been grown by the CVT process below the phase transition temperature. Crystallites grown by CVT have been found to have higher purity than bulk synthesized $ZnGeP_2$, and a second phase has been found which is not identified in the literature.

Zinc germanium diphosphide ($ZnGeP_2$) has useful properties for wavelength conversion devices in the mid-infrared (IR) spectral range. It has a high figure of merit as an optical parametric oscillator (OPO) and it also performs efficiently as a frequency doubler. Present crystal growth technology has been restricted to small volume charges because of the pressure limits of quartz containment vessels.

Clearly, many modifications and variations of the present invention are possible in light of the above teachings and it is therefore understood, that within the inventive scope of the inventive concept, the invention may be practiced otherwise than specifically claimed.

What is claimed is:

1. A process of producing single crystal of ZnGeP$_2$, said process comprising the steps of:

preparing a polycrystalline charge of ZnGeP$_2$, said preparing using the liquid encapsulated Kyropoulos process wherein an injector directly inputs phosphorus into a melt of Zn and Ge;

placing said charge and a transporting agent in a chemical vapor transport apparatus, said charge and said transporting agent being placed together in a sealed ampoule of said vapor transport apparatus, said ampoule having a charge region and a growth region, said ampoule being placed in a two zone furnace, said charge region being placed in a nutrient zone, said growth region being placed in a growth zone, said nutrient zone having a higher temperature than said growth zone;

heating said nutrient zone to a temperature above an equilibrium temperature of a reaction GeI$_4$ plus Ge equals 2 GeI$_2$ occurring between said charge and said transporting agent;

heating said growth zone to a temperature below said temperature in said nutrient zone;

allowing said temperatures to remain therein while said growth takes place in the growth zone;

cooling said crystals in said growth zone;

opening said ampoule while removing excess phosphorus and said transporting agent; and removing said single crystal of ZnGeP$_2$.

2. A process as defined in claim 1 wherein the LEK process inputs phosphorus into a melt of Zn and Ge by means of a movable injector, said injector having an ampoule therein having said phosphorus therein, said ampoule having a transfer tube connected therein, said ampoule being lowered to a heated crucible having said melt therein whereby the phosphorus is vaporized and enters said melt through said tube.

3. A process as defined in claim 2 wherein said nutrient zone is heated to a temperature of about 975° C.

4. A process as defined in claim 2 wherein said growth zone is heated to a temperature of about 875° C.

5. A process as defined in claim 1 wherein said transporting agent is iodine.

* * * * *